United States Patent [19]

Coutures

[11] Patent Number: 4,513,211
[45] Date of Patent: Apr. 23, 1985

[54] DEVICE FOR DETECTING THE PRESENCE OR ABSENCE OF A CHARGE QUANTITY AND FOR STORING THE RESULT OF THIS DETECTION

[75] Inventor: Jean L. Coutures, Paris, France

[73] Assignee: Thomson-CSF, Paris, France

[21] Appl. No.: 422,383

[22] Filed: Sep. 24, 1982

[51] Int. Cl.³ .................. H03K 3/356; H03K 5/153; G01R 19/165
[52] U.S. Cl. .................................. 307/530; 307/279; 377/60
[58] Field of Search ............... 307/279, 362, 363, 530; 377/58, 60

[56] References Cited

U.S. PATENT DOCUMENTS

| | | | |
|---|---|---|---|
| 3,623,132 | 11/1971 | Green | 307/362 |
| 3,949,245 | 4/1976 | Emmons | 307/304 |
| 3,979,603 | 9/1976 | Gosney | 377/63 |
| 4,039,860 | 8/1977 | Lambrechtse | 307/362 |
| 4,060,737 | 11/1977 | Gosney | 377/60 X |
| 4,181,865 | 1/1980 | Kohyama | 377/60 X |
| 4,295,061 | 10/1981 | Tokoda et al. | 307/279 |

OTHER PUBLICATIONS

Boonstra et al., "A4096-b One-Transistor Per Bit RAM with Internal Timing and Low Dissipation", IEEE-JSSC, vol.-SC-8, No. 5, pp. 305-310, 10/73.
Lambrechetse et al., 1973 IEEE-Int'l Solid-State Circuits Conf.; Digest of Technical Papers, pp. 26; 2/14/73.
Chakravarti et al., "High Gain Sense Amplifier"; IBM Tech. Discl. Bull.; vol. 20, No. 7, pp. 2607-2608; 12/77.

Primary Examiner—Larry N. Anagnos
Attorney, Agent, or Firm—Roland Plottel

[57] ABSTRACT

The device comprises a capacitor, first means for taking into account, in logic form, the potential of the capacitor, second means which, in a first time, fixes the potential of the capacitor to a given value, third means which, in a second time, modify or do not modify the potential of the capacitor, depending on whether or not the charge quantity to be detected is present or absent, and fourth means which, in a third time, reloop the output of the first means to the input of the first means, the output of the first means constituting the output of the detection and storage device.

Application to digitally programmable filters.

7 Claims, 3 Drawing Figures

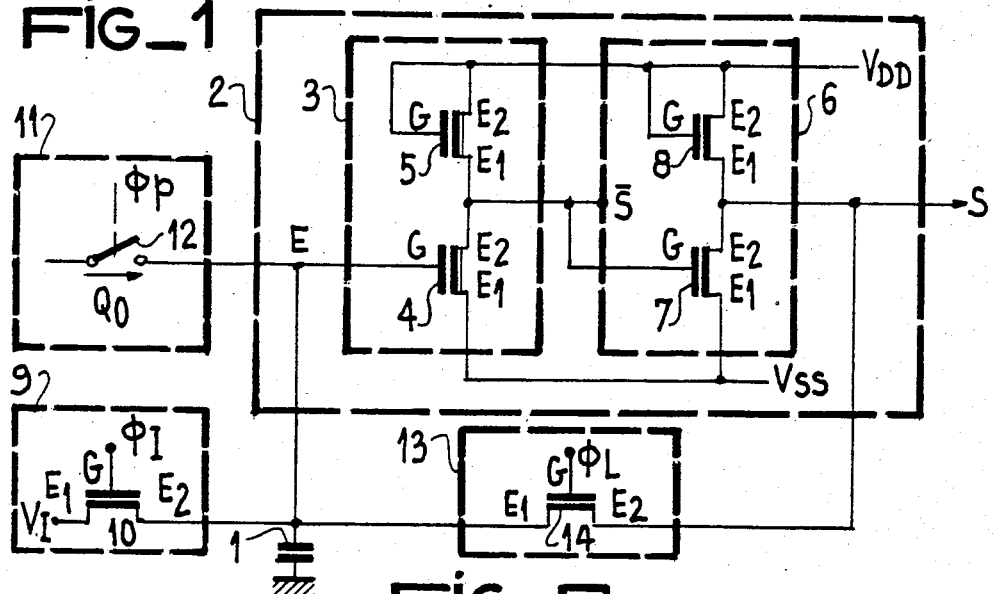
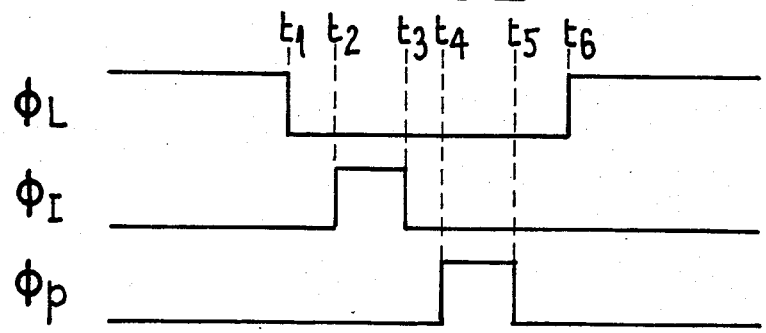
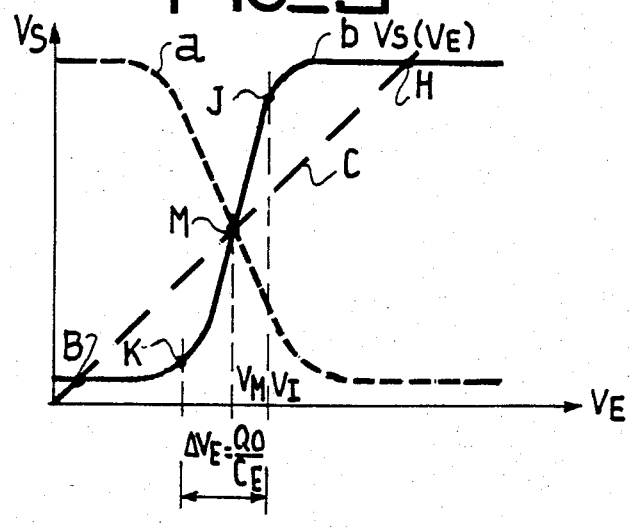

DEVICE FOR DETECTING THE PRESENCE OR ABSENCE OF A CHARGE QUANTITY AND FOR STORING THE RESULT OF THIS DETECTION

BACKGROUND OF THE INVENTION

The present invention relates to a device that detects the presence or absence of a charge quantity and stores the result.

Such a device is particularly used in charge transfer devices, specifically in filters which use charge transfer devices which are digitally programmable. In this type of filter, the M coefficients useful in the preparation of the transfer function of the filter, coded in a code with N bits, are stored in N charge transfer registers with M stages, called coefficient registers. The signal to be filtered is applied to the input of N other charge transfer registers with M stages, called signal registers. Each of the N signal registers is associated with one of the N coefficient registers (the size of the different signal registers increasing with the weight of the bits stored in the associated coefficient registers), and the stages of the same rank of each pair of registers formed in this way correspond.

A device for sensing or not sensing the charge transfer quantity obtained at the output of each of the stages of the signal register is associated with each pair of registers formed in this way, as a function of whether the bit stored in the corresponding stage of the associated coefficient register has the binary value 1 or the binary value 0.

A system of adders, supplying the output signal of the filter, is provided at the output of the different devices for counting the charge transfer quantity associated with the various signal register—coefficient register pairs.

A digitally programmable filter of this type is described in U.S. Pat. No. 4,316,258 assigned to Thomson-CSF.

Thus, there must be a device for detecting the presence or absence of the charge quantity obtained at the output of the considered stage of the coefficient register between the output of each of the stages of the different coefficient registers and the corresponding input of each of the different counting devices. The result of this detection conditions the operation of counting.

As the coefficients must also be stored during the processing of the signal, the device for detecting the presence or absence of the charge quantity must have a storage function. A device for detecting the presence or absence of a charge quantity and for storing the result thereof is described in U.S. Pat. No. 4,264,964 assigned to Thomson-CSF. This device is a semiconductor substrate on which are provided a group of electrodes controlled by periodic potentials.

These electrodes essentially consist of first and second electrodes, located in the extension of one another, and supplied from a first side, the first by the charge quantity to be detected and the second by a given charge quantity and from a second side by the charge quantity obtained at the output of a series of third electrodes arranged parallel to the two preceding electrodes, the first electrode of said series being supplied by a given charge quantity.

All these electrodes are controlled in such a way that initially the first and second electrodes are alternately blocked and conductive, thus permitting the introduction of a sample of the charge quantity to be detected.

At the output of these two electrodes, either a signal having a virtually constant level, is obtained or a square signal depending on whether a charge quantity to be detected is present or absent, this makes it possible to make a distinction between the presence and absence of a charge quantity. Then, the first and second electrodes are simultaneously separated from their respective supplies located on the first side, permitting the storage of the result of the detection.

However, the construction of the device for detecting the presence or absence of a charge quantity described in the aforementioned U.S. Patent is such that the level of the square signal obtained at the output of the first and second electrodes when a charge quantity to be detected is present is identical to the constant level of the signal obtained at the same output when the charge quantity to be detected is absent. To maintain the distinction between the presence and absence of the charge quantity possible during the storage of the result of this detection, there is provided initially and when the charges to be detected are present an advance beneath the series of third electrodes of the given charge quantity present at the input of the first of them, from the first to the last of them, so as to subsequently produce a variation in the level of the output signal of the first and second electrodes in the case of the presence of the charge quantity to be detected.

The device for detecting the presence or absence of the charge quantity and for storing the result thereof described in the aforementioned patent has complex construction and operation, so that the control signals applied to the different electrodes are complex.

BRIEF SUMMARY OF THE INVENTION

The invention relates to a device for the detection of the presence or absence of a charge quantity and for storing the result of this detection, making it possible to obtain the same results, but having a greatly simplified construction and operation.

The device according to the invention is also very sensitive to the detection of very small charge quantities and has a great storage stability, despite temperature variations or polarization fluctuations.

The present invention specifically relates to a device for detecting the presence or absence of a charge quantity and for storing the result of this detection. It has a capacitor and first means for sensing, in logic form, the potential $V_E$ of the capacitor. The output of the first means constitutes the output of the detection and storage device; the input and output of the first means is respectively at high and low impedance, the potential $V_S$ of the output is able to assume two stable states; and the response curve $V_S(V_E)$ of the first means has a gain greater than one in the transition zone between the two stable states. The device also has second means for precharging, in a first time, the potential of the capacitor at a given value, so as to have an operating point located in a first zone of the response curve $V_S(V_E)$ of the first means where $(V_S/V_E)-1$ has a first sign; and third means which, in a second time, modifies or does not modify the potential of the capacitor, depending on whether or not the charge quantity is present or absent, in such a way as to bring the operating point into a second zone of the responsive curve $V_S(V_E)$ of the first means where $(V_S/V_E)-1$ has a second sign, or to maintain it in the first zone, depending on whether or not the charge quantity is present or absent and fourth means which, in a third time, latches the input potential $V_E$ of the first means equal to the output potential $V_S$ of the first means, in such a way that the output potential $V_S$ of the first means is at the stable state of the response curve $V_S(V_E)$ corresponding to the second or to the first zone, depending on whether the charge quantity is present or absent.

BRIEF DESCRIPTION OF THE DRAWINGS

The invention is described in greater detail hereinafter relative to a non-limitative embodiment and with reference to the attached drawings, wherein show:

FIG. 1 a diagram of a detection and storage device according to the invention.

FIG. 2 a time diagram for the different signals used for controlling the device of FIG. 1.

FIG. 3 the transfer curve $V_S(V_E)$ of the first means forming part of the detection and storage device according to the invention.

DETAILED DESCRIPTION OF THE PREFERRED EMBODIMENT

The detection and storage device of FIG. 1 comprises a capacitor 1 of capacitance $C_E$, provided with a first terminal connected to earth and a second terminal connected to the input E of the first means 2 able to sense, in logic form, potential $V_E$ of capacitor 1. These first means 2 are provided with a low impedance output S, their input E being at high impedance. The output potential $V_S$ of the first means 2 can assume two stable states the response curve $V_S(V_E)$ of the first means 2 having a gain higher than 1 in the transition zone between these two stable states.

In an exemplified embodiment corresponding to FIG. 1, the first means 2 are constituted by two inverters in series. A first inverter 3 is realized by means of a MOS transistor 4 with an enhanced or enriched channel and a MOS transistor 5 with a depleted channel, both functioning as amplifiers.

MOS transistor 4 is provided with a control electrode G constituting the input E of the first means 2, an electrode $E_1$ receiving a continuous potential $V_{SS}$ and an electrode $E_2$ connected to the source of MOS transistor 5.

Control electrode G and electrode $E_2$ of MOS transistor 5 receive a continuous potential $V_{DD}$. The output of the first inverter 3 is connected at the common point constituted by electrode $E_2$ of MOS transistor 4 and electrode $E_1$ of MOS transistor 5.

Inverter 6 is produced in an identical way by means of a MOS transistor 7 with an enriched or an enhanced channel and a MOS transistor 8 with a depleted channel, connected identically to transistors 4 and 5, except that control electrode G of MOS transistor 7 is connected to the output S of inverter 3. The common point of electrode $E_2$ of MOS transistor 7 and electrode $E_1$ of MOS transistor 8 constitutes the output S of the first means 2.

The second terminal of capacitor 1 is also connected to the output of second means 9 permitting, in a first time, the fixing of potential $V_E$ of capacitor 1 at a given value $V_I$. In the case of the embodiment of FIG. 1, the second means 9 are realised by means of a switching MOS transistor 10 operating by switching. This MOS transistor 10 is provided with a control electrode G receiving a control signal $\phi_I$, an electrode $E_1$ receiving the given potential $V_I$ and an electrode $E_2$ connected to the second terminal of capacitor 1.

The second terminal of capacitor 1 is also connected to the output of third means 11 permitting, in a second time, the modification of non-modification of potential $V_E$ of capacitor 1, depending on whether or not a charge quantity is present or absent. The third means 11 is symbolically shown in FIG. 1 with the aid of a switch 12, provided with a control input receiving a control signal $\phi_P$, an input receiving the charge quantity $Q_o$ to be detected and an output connected to the second terminal of capacitor 1.

In the scope of application to digitally programmable filters envisaged hereinbefore, the input of third means 11 is connected to that portion of the semiconductor substrate corresponding to one stage of a coefficient register, the control input of the third means 11 receiving the control signal authorizing the charge transfer to the considered stage of the coefficient register, and the output of the third means 11 is also connected to the second terminal of capacitor 1.

Finally, the detection and storage device comprises fourth means 13 permitting, in a third time, to make the input potential of the first means 2 equal to the output potential of said first means.

In an embodiment corresponding to FIG. 1, fourth means 13 comprises a MOS transistor 14, provided with a control electrode G, to which is applied a control signal $\phi_L$, an electrode $E_1$ connected to the input E of the first means 2 and an electrode $E_2$ connected to the output S of first means 2. Capacitor 1 can advantageously be constituted by the drain and source stray diffusion capacitance of transistors 10 and 14 at point E.

The operation of the detection and storage device of FIG. 1 will now be described relative to FIGS. 2 and 3.

The detection of the charge quantity and the storage of the result of this detection involves six successive times t1, t2, t3, t4, t5 and t6 in the time diagram of FIG. 2.

The path of the control signals is given in exemplified manner for N channel MOS transistors, but P channel MOS transistors could also be used by merely making the control signal undergo the changes imposed by this change of sign.

At time t1, control $\phi_L$ passes from the high state to the low state and transistor 14 passes from the conductive state to the blocked state. The flip-flop defined by the two inverters 3 and 6 in series is then in open loop.

At time t2, when the flip-flop defined by the two inverters 3 and 6 in series is still in open loop, control $\phi_I$ passes from the low state to the high state and transistor 10 becomes conductive. Capacitor 1 is then precharged to potential $V_I$. The choice of potential $V_I$ is determined on the basis of the following considerations with reference to FIG. 3. FIG. 3 shows in dotted line from a curve (a), which is the response curve of inverter 3 and in continuous line form a curve (b) which is the response curve $V_S(V_E)$ of two inverters 3 and 6 in series.

FIG. 3 also shows by means of more widely spaced dotted lines the bisector (c), i.e. the groups of points for which $V_S$ is equal to $V_E$. Each of the curves (a) and (b) has two stable states separated by a transition zone.

In order to obtain a correct operation of the detection and storage device according to the invention, it is necessary for the response curve $V_S(V_E)$ to have a gain above 1 in the transition zone, i.e. it intersects bisector (c) at three points. One of these points M is located in the transition zone, whilst the two other points B and H are located on the stable states, respectively of low level and high level.

This condition can also be expressed in the following way. If the length of the channel of transistors 4 and 7 is designated $L_1$ (i.e. the distance separating the two diffusions constituting the drain and source of these transistors), the width of the channel of transistors 4 and 7 by $W_1$ (i.e. the dimension of the channel in a transverse direction), the length and width of the channel of transistors 5 and 8 by $L_2$ and $W_2$ respectively the ratio $W_1/L_1$ by $B_1$ and the ratio $W_2/L_2$ by $B_2$, it is necessary for $B_1$ to be well above $B_2$.

Bisector (c) defines two zones on response curve $V_S(V_E)$, a first zone in which $V_S$ is above $V_E$, i.e. where $V_S/V_E - 1$ is positive and a second zone where $V_S$ is below $V_E$, i.e. $V_S/V_E - 1$ is negative.

Potential $V_I$ must be such that the corresponding operating point on response curve $V_S(V_E)$ is in the zone where $V_S > V_E$ or in the zone $V_S < V_E$, depending on whether the charges to be detected are electrons or holes.

In other words, depending on whether the charges to be detected are electrons or holes, potential $V_I$ must be above or below potential $V_M$, i.e. at potential $V_E$ for which the operating point on curve $V_S(V_E)$ is point M defined hereinbefore.

In exemplified manner, FIG. 3 shows the case where the charges to be detected are electrons, which gives an operating point, corresponding to potential $V_I$, located in the zone of curve $V_S(V_E)$ in which $V_S > V_E$. This operating point is designated J in FIG. 3.

At time t3, with control $\phi_L$ still at low level, control $\phi_I$ again passes to the low state, so that the potential of capacitor 1 then becomes floating.

At time t4, with control $\phi_L$ still at low level, control $\phi_P$ passes from the low state to high state, leading to the closing of switch 12 and consequently to the injection of the charge quantity to be detected. If the charge quantity $Q_o$ to be detected exists and is negative, the potential of capacitor 1 decreases, as from value $V_I$, by a quantity $V_E$ equal to $Q_o/C_E$, defining a new operating point K located in the zone of the curve $VS(V_E)$, in which $V_S < V_E$. Conversely, if the charge quantity $Q_o$ is zero, the potential $V_E$ of capacitor 1 remains constant and equal to $V_I$ and the operating point is maintained at J.

At time t5, when control $\phi_L$ is still at low state, control $\phi_P$ passes again to low level, thus stopping the injection of possibly charges to be detected.

At time t6, control $\phi_L$ again passes to high level. Transistor 14 then becomes conductive and the flip-flop formed by the two inverters 3 and 6 in series is latched. As output S and input E of this flip-flop are respectively of low and high impedance, output S then imposes its potential on input E.

Thus, if there is a negative charge quantity to be detected, as the operating point on $V_S(V_E)$ is in the zone where $V_S < V_E$ in times t4 and t6, $V_E$ tends to decrease after time t6. The operating point is thus stablized in the stable low level part of curve $V_S(V_E)$ and more precisely at point B, because the operating point is then necessarily located on bisector (c). Conversely, if there are no charges to be detected, as the operating point on $V_S(V_E)$ is located in the zone where $V_S > V_E$ between times t4 and t6, $V_E$ tends to increase after time t6. Thus, the operating point is stabilized in the stable high level part of curve $V_S(V_E)$ and more specifically at point H, because the operating point is then necessarily located on bisector (c).

This reasoning will be the same in the case of detecting a positive charge quantity and only the displacement directions on curve $V_S(V_E)$ would be reversed compared with the detection of the negative charge quantity.

After time t6, the detection result is stored and is available at output S of flip-flop formed by inverters 3 and 6 in series.

It should be noted that the complementary result is available at output $\overline{S}$ of inverter 3, which may sometimes be of interest.

After time t6, it is possible to carry out the detection of the presence or absence of a new charge quantity and also the storage of the result of said detection.

On referring to FIG. 3, it can be seen that as potential $V_I$ approaches potential $V_M$, the charge quantity which can be detected decreases, because the lower the potential drop necessary at the zone changes on curve $V_S(V_E)$. It is therefore one of the advantages of the device according to the invention that it can detect a small charge quantity by means of an adequate setting of the polarization potential $V_I$. This sensitivity to a low charge quantity is further improved on reducing the capacitance of capacitor 1, which takes place e.g. when capacitor 1 is reduced on the drain and source stray diffusion capacitances of transistors 10 and 14 at point E.

Moreover, the device according to the invention retains a storage stability for polarization variations on $V_{DD}$ or accidental temperature variations.

What is claimed is:

1. A device for detecting the presence or absence of a charge quantity and for storing the result, comprising:

a capacitor (1);

first means (2) having an input and an output for sensing in the form of a high or a low level, a potential $V_E$ of the capacitor, the output of said first means constituting an output of the detection and storage device, the input and output of said first means being respectively at high and low impedance, a potential $V_S$ of said output being able to assume two stable states and said first means having a response curve $V_S(V_E)$ with a gain greater than one in the transition zone between the two stable states;

second means (9) for precharging in a first time, the potential of the capacitor at a given value, so as to have an operating point located in a first zone of the response curve $V_S(V_E)$ of the first means where $(V_S/V_E) - 1$ has a first sign;

third means (11) which, in a second time, modifies or does modify the potential of the capacitor, depending on whether or not the charge quantity is present or absent, in such a way as to bring the operating point into a second zone of the response curve $V_S(V_E)$ of the first means, where $(V_S/V_E) - 1$ has a second sign, or to maintain it in the first zone, depending on whether or not the charge quantity is present or absent; and fourth means (13) which, in a third time latches the input potential $V_E$ of the first means to equal the output potential $V_S$ of the first means, such that the output potential $V_S$ of the first means is at the stable state of the response curve $V_S(V_E)$ corresponding to the second or to the first zone, as a function of whether the charge quantity is present or absent.

2. A device according to claim 1, wherein the first means comprises first and second inverters in series, the input of the first inverter being connected to one of the terminals of the capacitor, the other terminal of the capacitor being at reference potential, and the output of the second inverter constituting the output of the detection and storage device.

3. A device according to claim 1, wherein the second means comprises a MOS transistor, provided with a first electrode receiving a given potential $V_I$, a second electrode connected to one of the terminals of the capacitor, the other terminal of the capacitor being at a reference potential, and a control electrode receiving a control signal $\phi_I$, such that the MOS transistor is conductive during the first time and blocked outside said first time.

4. A device according to claim 3, wherein the capacitor (1) is constituted by the drain and source stray diffusion capacitance of the MOS transistor (10) included in the second means.

5. A device according to claim 1, wherein the third means comprises a switch, provided with an input receiving the charge quantity to be detected, an output connected to one of the terminals of the capacitor, the other terminal of the latter being at reference potential, and a control input receiving a control signal such that said switch is closed during the second time and open outside said second time.

6. A device according to claim 1, wherein the fourth means comprises a MOS transistor, provided with a first electrode connected to the input of the first means, a second electrode connected to the output of the first means, and a control input receiving a control signal, such that said MOS transistor is conductive during the third time and blocked outside said third time.

7. A device according to claim 6, wherein the capacitor (1) is constituted by the drain and source stray diffusion capacitance of the MOS transistor (14) included in the fourth means.

* * * * *